United States Patent [19]

Tamura et al.

[11] 4,172,384

[45] Oct. 30, 1979

[54] TEMPERATURE MEASURING APPARATUS

[75] Inventors: Hiroshi Tamura, Yokohama; Masao Kato, Ichikawa; Yukuya Tokumaru; Masanori Nakai, both of Yokohama, all of Japan

[73] Assignee: Tokyo Shibaura Electric Co., Ltd., Japan

[21] Appl. No.: 909,303

[22] Filed: May 24, 1978

[30] Foreign Application Priority Data

May 24, 1977 [JP] Japan .................................. 52-59417

[51] Int. Cl.$^2$ ............................................. G01K 7/24
[52] U.S. Cl. ............................ 73/362 AR; 73/362 SC
[58] Field of Search ..................... 73/362 AR, 362 SC; 331/65, 66

[56] References Cited

U.S. PATENT DOCUMENTS

| 3,398,579 | 8/1968 | Carniol et al. ......................... 331/66 |
| 4,050,309 | 9/1977 | Junkert et al. ................. 73/362 AR |
| 4,065,758 | 12/1977 | Barbier et al. ..................... 73/362 SC |
| 4,090,151 | 5/1968 | Presset et al. ......................... 331/66 |
| 4,107,626 | 8/1978 | Kiewit ..................................... 331/65 |

*Primary Examiner*—S. Clement Swisher
*Attorney, Agent, or Firm*—Finnegan, Henderson, Farabow & Garrett

[57] ABSTRACT

A measuring apparatus comprises: a first series circuit having first and second resistors connected between a power source terminal and ground; a second series circuit having a thermistor and a third resistor connected between the power source and ground; a first variable frequency oscillator for generating a pulse signal with the frequency corresponding to the current derived from the junction between the first and second resistors of the first series circuit; a second variable frequency oscillator for generating a pulse signal with the frequency corresponding to the current derived from the junction between the thermistor and the third resistor; a first counter which counts the pulse signal from the second variable frequency oscillator to produce a high level signal till it counts a given number of pulses; and AND gate connected to the output terminal of the first variable frequency oscillator and the first counter, a second counter for counting the pulse fed from the first variable frequency oscillator via the AND gate; and a display circuit for displaying the contents of the counter. The first and second variable oscillating circuits each have an odd number of inverters which are cascade-connected and each formed of an integrated injection logic circuit with a power receiving terminal connected to the first or second series circuit, the output terminal of the last stage inverter being connected to the input terminal of the first stage inverter.

6 Claims, 3 Drawing Figures

TEMPERATURE MEASURING APPARATUS

BACKGROUND OF THE INVENTION

The invention relates to a measuring apparatus for measuring an analogue quantity such as temperature.

A conventional measuring apparatus such as a temperature measuring apparatus is provided with a bridge circuit including thermistors and an analogue to digital converter for converting an output signal corresponding to an ambient temperature and produced from the bridge circuit into the corresponding digital signal. The analogue to digital converter, however, is complex in construction and is not adapted to an integrated circuit fabrication because of including capacitors.

SUMMARY OF THE INVENTION

Accordingly, an object of the invention is to provide a measuring apparatus which can precisely measure an analogue quantity such as temperature and is adaptable for an integrated circuit fabrication.

According to one aspect of the invention, a measuring apparatus comprising: an analogue quantity sensing circuit for generating a first signal corresponding to an analogue quantity to be measured and a second signal corresponding to a reference analogue quantity; a first variable frequency oscillating circuit having an odd number of inverters which are cascade-connected and each formed of an integrated injection logic circuit receiving the first output signal of the analogue quantity sensing circuit at a power receiving terminal, the output terminal of the last stage inverter being connected to the input terminal of the first stage inverter; a second variable frequency oscillating circuit having an odd number of inverters which are cascade-connected and each formed of an integrated injection logic circuit receiving the second output signal of the analogue quantity sensing circuit at a power receiving terminal, the output terminal of the last stage inverter being connected to the input terminal of the first stage inverter; and a signal processing circuit which processes the output signals from the first and second variable frequency oscillating circuits to produce an output signal corresponding to an analogue quantity to be measured.

DESCRIPTION OF THE PREFERRED EMBODIMENTS

Figure 1:
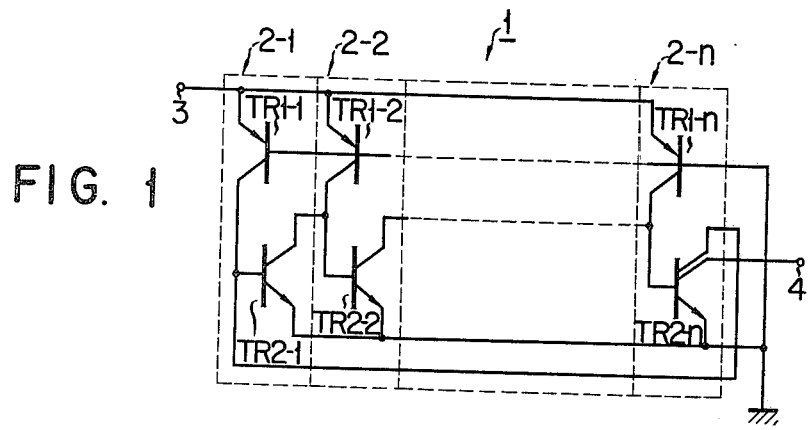
FIG. 1 shows a circuit diagram of a variable frequency oscillator circuit used in an embodiment of the invention.

In FIG. 1, a variable frequency circuit 1 is provided with an odd number of inverters 2-1 to 2-n which are cascade-connected. The inverters 2-1 to 2-n are each formed of a couple of NPN and PNP transistors; PNP transistors in those inverters are designated by TRI-1 to TR1-n and NPN transistors, by TR2-1 to TR2-n, respectively, as shown. In other words, the inverter 2 is formed of an integrated injection logic circuit including transistors TR1 and TR2. A power receiving terminal 3 of the integrated injection logic circuit is connected to the emitter of the transistor TR1 which is connected at the collector to the base of the transistor TR2. The collector of the NPN transistor TR1 is connected to the base of the NPN transistor in the succeeding stage of inverter. The base of the transistor TR1 and the emitter of the transistor TR2 are both grounded. The NPN transistor TR2-n in the final stage of inverter 2-n is a double collector transistor and is connected at the first collector to the base of the NPN transistor TR2-1 of the first stage inverter 2-1 and at the second collector to the output terminal 4 of the variable frequency oscillator 1. The delay time of the inverter 2 changes depending on the circuit current so that the oscillating frequency of the variable frequency oscillator 1 changes depending on the power source current fed through the power receiving terminal 3. The power source current fed to the power receiving terminal 3 is substantially proportional to the oscillating frequency of the variable frequency oscillator 1.

Figure 2:
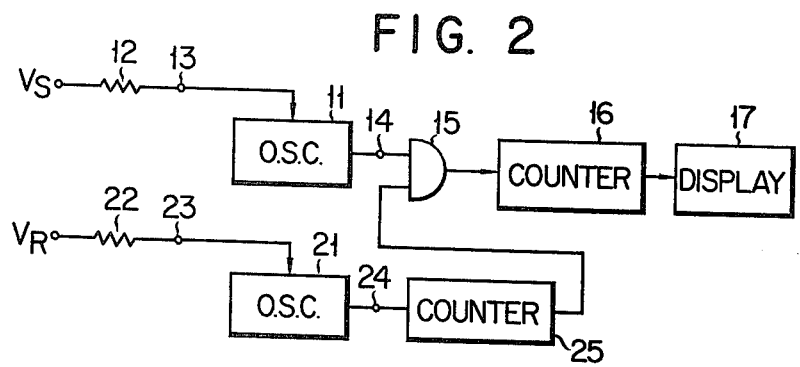
FIG. 2 shows a circuit diagram of a measuring apparatus according to one embodiment of this invention and using the variable frequency oscillator circuit shown in FIG. 1.

Turning now to FIG. 2, there is shown an embodiment of an analogue quantity measuring circuit using the variable frequency oscillator shown in FIG. 1. The example shown in FIG. 2 is provided with a couple of variable frequency oscillators 11 and 21 constructed like the variable frequency oscillator in FIG. 1. A voltage signal Vs corresponding to an analogue quantity, e.g. temperature, is applied to a power receiving terminal 13 of a variable frequency oscillator 11, through a resistor 12. A reference voltage signal VR corresponding to a reference analogue quantity is applied to a power receiving terminal 23 of a variable frequency oscillator 21, through a resistor 22. The output terminal 24 of the variable frequency oscillator 21 is connected to a counter 25 which produces a high level signal during the interval from count 0 to count C1. The output terminal of the counter is connected to one input terminal of an AND gate 15 of which the other input terminal is connected to the output terminal 14 of the variable frequency oscillator 11. The output terminal of the AND gate 15 is coupled with the input terminal of the counter 16 which is connected at the output terminal to the input terminal of the counter 16. The counter 16 is connected at the output terminal to the display device 17 for displaying the contents of the counter 16.

The oscillating frequencies of the variable frequency oscillators 11 and 21 are given $$fs = K_s V_s / R_s \tag{1}$$

$$f_R = K_R V_R / R_R \tag{2}$$

where Ks and $K_R$ are proper constants of the oscillators 11 and 21 and Rs and $R_R$ are resistances of the resistors R12 and R22.

The counter 25 produces a high level signal until it counts the pulse with frequency generated from the variable frequency oscillator 21 by the reference voltage $V_R$ and reaches a count of C1, and the high level signal enables the AND gate 15. Upon enabling the AND gate 15, the pulse with frequency fs generated from the frequency oscillator 11 by the voltage Vs is supplied to the counter 16 through the AND gate 15. The count value Cs counted by the counter 16 is given as follows:

$$Cs = fs/f_R \times C1 = K_s \cdot V_s \cdot R_R K_R \cdot V_R R_s \times C1 \tag{3}$$

If the variable frequency oscillators 11 and 21 are constructed so that the constants Ks and $K_R$ are equal, and the resistances of the resistors R12 and R22 are equal, i.e. $Rs = R_R$, the following equation is obtained.

$$Cs = Vs/V_R \times Cl \qquad (4)$$

As seen from the equation (4), the count value Cs is proportional to the input voltage Vs.

When the variable frequency oscillators 11 and 21 are fabricated on a chip by the integrating technology, these oscillators are placed under the same temperature condition so that errors of the oscillators 11 and 21 due to temperature difference are cancelled to each other.

Figure 3:
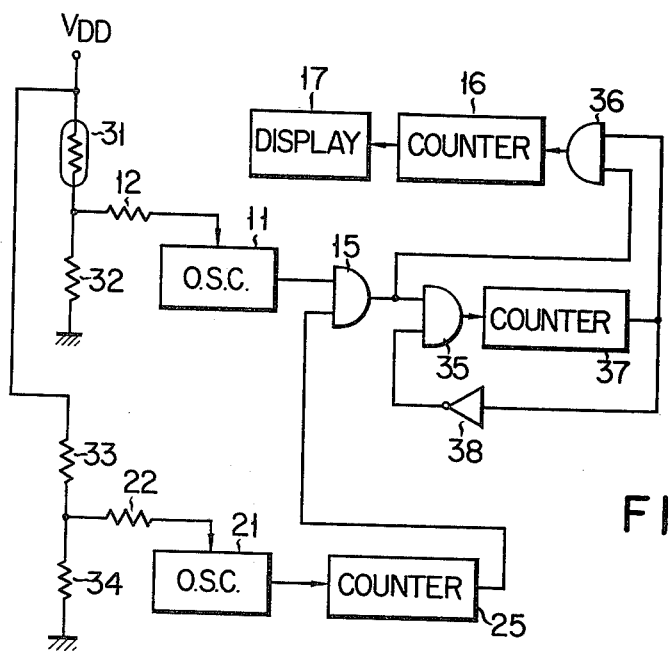
FIG. 3 shows a circuit diagram of a temperature measuring apparatus according to another embodiment of the invention.

FIG. 3 shows a circuit diagram of a temperature measuring circuit which comprises two variable frequency oscillators 11 and 21, a counter 25, an AND gate 15, a counter 16 and a display device 17, as in the case of FIG. 2. Additionally, the temperature measuring circuit is provided with a series circuit having a thermistor 31 and a resistor 32 and another series circuit having resistors 33 and 34. These series circuits are connected in parallel between a power source terminal $V_{DD}$ and ground. The junction between the thermistor 31 and the resistor 33 is connected to the power receiving terminal of the variable frequency oscillator 11 through the resistor 12, with the result that the current based on the resistance ratio of the thermistor 31 to the resistor 32 is fed to the power receiving terminal. The junction between the resistors 33 and 34 is connected to the power receiving terminal of the oscillator 21 through a resistor 22, with the result that the current based on the resistance ratio of the resistor 32 to another resistor 33 is fed to the power receiving terminal.

The output terminal of the END gate 15 is coupled with one of the input terminals of an AND gate 35 and one input terminal of an AND gate 36 of which the output terminal is coupled with the input terminal of the counter 16. The output terminal of the AND gate 35 is connected to the input terminal of the counter 37 which is connected at the output terminal directly to the other input terminal of the AND gate 36 and through an inverter 38 to the other input terminal of the AND gate 35.

The temperature range where the resistance of the thermistor 31 linearly changes with temperature change is narrow. Accordingly, the counter in FIG. 3 is so designed that it produces a high level signal when the contents of the counter 37 reaches C2 (C2<C1) corresponding to the minimum value of the linearly changing range of the resistance of the thermistor.

In operation, upon application of a voltage from the junction between the resistors 33 and 34, the variable frequency oscillator 21 oscillates at the reference frequency fs to produce pulses with the same frequency. The counter 25 produces a high level signal until the pulse from the oscillator 21 counts up to C1, thus enabling the AND gate 15. On the other hand, the application of a voltage from the junction between the thermistor 31 and the resistor 32 drives the variable frequency oscillator 11 to produce pulses with variable frequency fs. The pulse signal from the oscillator 11 is applied through the AND gates 15 and 35 to the counter 37 where it is counted as long as the AND gate 15 is enabled, i.e. until the counter 25 counts from 0 to Cl. When the contents of the counter 37 reaches count C2, the counter 37 produces a high level signal to disable the AND gate 35 while enable the AND gate 36. As a result, the pulse signal from the oscillator 11 is applied to the counter 16 through the AND gates 15 and 16. The count Cs counted by the counter 16 is expressed $$Cs = Cl \times fs/f_R - Cl.$$

The frequency is kept substantially constant and the frequency fs changes proportional to temperature change. The contents of the counter are displayed by the display device 17.

What we claim is:
1. A measuring apparatus comprising:
    a reference signal generating circuit for generating a reference signal;
    an analogue quantity sensing circuit for generating a signal corresponding to an analogue quantity to be measured;
    a first variable frequency oscillating circuit having an odd number of inverters which are cascade-connected and each formed of an integrated injection logic circuit receiving an output signal of said reference signal generating circuit at a power receiving terminal, the output terminal of the last stage inverter being connected to the input terminal of the first stage inverter and said first variable frequency oscillating circuit producing an output signal whose frequency corresponds to the output signal from said reference signal oscillating circuit;
    a second variable frequency oscillating circuit having an odd number of inverters which are cascade-connected and each formed of an integrated injection logic circuit receiving an output signal of said sensing circuit at a power receiving terminal, the output terminal of the last stage inverter being connected to the input terminal of the first stage inverter and said second variable frequency oscillating circuit producing an output signal whose frequency corresponds to the output signal from said sensing circuit; and
    a signal processing circuit which processes the output signals from said first and second variable frequency oscillating circuits and derives from said both output signals an output signal corresponding to the output signal of said analogue quantity sensing circuit.

2. A measuring apparatus according to claim 1, wherein said signal processing circuit comprises a first counting circuit which is connected to said first variable frequency oscillating circuit and counts the output signal from said first variable frequency oscillator to produce a high level signal in a preset counting range, an AND circuit connected to the output terminals of said first counting circuit and said second variable frequency osicllating circuit, and a second counting circuit connected to the output terminal of said AND circuit.

3. A measuring apparatus according to claim 1, wherein said signal processing circuit comprises a first counting circuit which is connected to said first variable frequency oscillating circuit and counts the output signal from said first variable frequency oscillator to produce a high level signal in a preset counting range, a first AND circuit connected to the output terminals of said first counting circuit and said second variable frequency oscillating circuit, a second counting circuit which counts the output signal from said first variable frequency oscillating circuit and, when its contents reaches a predetermined count, produces a high level signal, a second AND circuit connected to said first AND circuit and said second counting circuit, and a third counting circuit connected to the output terminal of said second AND circuit.

4. A measuring apparatus according to claim 1, wherein said reference signal generating circuit comprises first and second power source terminals, and a series circuit having first and second resistors connected between said first and second power source terminals, the junction between said first and second resistors in connected to the power receiving terminal of the integrated injection logic circuit in said first variable frequency oscillating circuit, said analogue quantity detection circuit is comprised of a series circuit having a thermistor and a third resistor connected between said first and second power source terminals and the junction between said thermistor and said third resistor is connected to the power receiving terminal of the integrated injection logic circuit of said second variable frequency oscillating circuit.

5. A measuring apparatus according to any one of preceding claims 1 to 4, further comprises a display unit.

6. A measuring apparatus according to any one of preceding claims 1 to 4, wherein said first and second variable frequency oscillating circuits are formed in a single chip.

* * * * *

UNITED STATES PATENT AND TRADEMARK OFFICE
CERTIFICATE OF CORRECTION

PATENT NO. : 4,172,384

DATED : October 30, 1979

INVENTOR(S) : HIROSHI TAMURA ET AL

It is certified that error appears in the above—identified patent and that said Letters Patent are hereby corrected as shown below:

In the Title of Patent [54] the word TEMPERATURE has been added to the title. The correct title should be:

MEASURING APPARATUS

Column 4, line 53 "osicllating" should read --oscillating--.

Column 5, line 8, "in" should read --is--.

Signed and Sealed this

Eleventh Day of March 1980

[SEAL]

Attest:

SIDNEY A. DIAMOND

Attesting Officer     Commissioner of Patents and Trademarks